(12) United States Patent
Lauffer et al.

(10) Patent No.: US 6,519,843 B2
(45) Date of Patent: Feb. 18, 2003

(54) METHOD OF FORMING A CHIP CARRIER BY JOINING A LAMINATE LAYER AND STIFFENER

(75) Inventors: John M. Lauffer, Waverly, NY (US); Heike Marcello, Brackney, PA (US); David J. Russell, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 09/772,418

(22) Filed: Jan. 30, 2001

(65) Prior Publication Data

US 2001/0018799 A1 Sep. 6, 2001

Related U.S. Application Data

(62) Division of application No. 09/195,389, filed on Nov. 18, 1998, now Pat. No. 6,195,264.

(51) Int. Cl.[7] .................................................. H05K 3/34
(52) U.S. Cl. ............................ 29/840; 29/830; 29/832; 29/833; 29/740
(58) Field of Search ......................... 29/890, 832, 833, 29/841, 740, 739, 831

(56) References Cited

U.S. PATENT DOCUMENTS

| | | | |
|---|---|---|---|
| 4,371,912 A | * | 2/1983 | Guzik |
| 4,566,186 A | | 1/1986 | Bauer et al. |
| 4,788,767 A | * | 12/1988 | Desai et al. |
| 4,918,811 A | * | 4/1990 | Eichelberger et al. |
| 5,153,710 A | | 10/1992 | McCain |
| 5,206,986 A | * | 5/1993 | Arai et al. |
| 5,432,677 A | | 7/1995 | Mowatt et al. |
| 5,450,286 A | | 9/1995 | Jacques et al. |
| 5,566,448 A | * | 10/1996 | Bhatt et al. |
| 5,629,241 A | | 5/1997 | Matloubian et al. |
| 5,637,919 A | | 6/1997 | Grabbe |
| 5,972,140 A | | 10/1999 | Hass et al. |
| 6,020,221 A | | 2/2000 | Lim et al. |
| 6,389,687 B1 | * | 5/2002 | Glenn et al. |

* cited by examiner

Primary Examiner—Carl J. Arbes
(74) Attorney, Agent, or Firm—RatnerPrestia; Lawrence R. Fraley

(57) ABSTRACT

A cavity-type chip module. The module is formed with an adhesive joining layer of photoimageable material interposed between a metal stiffener and a laminate top layer with a central aperture defined in the top layer. The photoimageable material is exposed to actinic radiation, except for an area corresponding to the aperture in the top layer. The unexposed area of photoimageable material is developed away to form a window in the joining layer. The top layer, joining layer, and stiffener are laminated together with the window and aperture aligned, and with a portion of the stiffener spanning the aperture to define a cavity in the resulting substrate. The removal of the unexposed photoimageable material, and the selective exposure of the joining layer to actinic radiation, keep the cavity free of photoimageable material and inhibit bleeding of the photoimageable material into the cavity from its inner edge. As a result, a semiconductor component can be flush mounted in the cavity with optimal thermal conductivity to the metal stiffener.

7 Claims, 2 Drawing Sheets

METHOD OF FORMING A CHIP CARRIER BY JOINING A LAMINATE LAYER AND STIFFENER

This application is a divisional of U.S. patent application Ser. No. 09/195,389 filed on Nov. 18, 1998, now U.S. Pat. No. 6,195,204 which has been allowed.

TECHNICAL FIELD

The present invention relates generally to the field of substrates on which electronic devices are mounted and, in particular, to a laminate substrate which includes a laminate layer and a stiffener attached to the laminate layer.

BACKGROUND OF THE INVENTION

Laminate substrates are generally made from any of a variety of epoxy-based resin materials, and are used for printed circuit boards, cards, semiconductor chip modules, and the like. Electronic devices, such as semiconductors, are mounted and electrically coupled to such laminate substrates using a variety of techniques known in the art, such as wire bonding or solder bumps.

Certain electronic devices and applications require the laminate substrate to be stiffened, especially if the laminate substrate is relatively thin or flexible, such as a "thin-light card (TLC)." Cavity-type laminate substrates are often constructed with stiffeners. Such cavity-type substrates generally have a planar, laminate layer with a cavity or aperture defined in the laminate layer and a stiffener made of a sheet of copper adhered to the bottom surface of the laminate layer. A portion of the surface of the copper stiffener spans the aperture in the laminate layer and thus is accessible for further processing. For example, the stiffener serves not only to strengthen the overall card structure, but, as discussed further below, may also act as one or more of a ground plane, mounting surface, and heat dissipation layer.

An electronic device, generally a semiconductor chip or die, is positioned on the exposed portion of the copper stiffener within the area defined by the inside edge of the aperture. For purposes of this document, the terms semiconductor device, chip, and die are used interchangeably. The copper stiffener acts as a heat sink for the semiconductor chip mounted on the stiffener. Wire bonds extend from pads at or near the inside edge of the aperture to opposing areas on the chip, thereby forming electrical connections between the chip and any circuits patterned in the substrate.

The size of the aperture in cavity-type substrates is usually selected to be close to, but slightly larger than, the outer dimension or perimeter of the electronic device destined to be placed in the aperture. This arrangement has the advantage of minimizing the distance through which the wire bonds extend, that is, the distance between the inside edge of the aperture and the locations on the chip to which the wire bonds attach. Shorter wire-bond lengths are generally desirable because they enhance the electrical connection to the chip, the reliability of the associated package, and the yield.

It is also important for the chip to be seated evenly on, and generally flush against, the underlying stiffener. If portions of the chip are separated from the copper stiffener, then the ability of the stiffener to dissipate heat from the chip is reduced, causing the chip potentially to overheat and eventually fail prematurely. Furthermore, an unevenly seated chip is more likely to crack in response to thermal stress. Uneven seating of the chip also may adversely affect the proper functioning of the conductive paths between the chip, the wire bonds, and the circuitry of the laminate substrate.

One of the challenges inherent to cavity circuit board products is joining the copper stiffener properly to the corresponding surface of the circuit board with just the right amount of adhesive at the optimal locations. In general, too much adhesive in the wrong places compromises the performance of the semiconductor mounted on the resulting laminate substrate. Too little adhesive compromises the structural integrity of the substrate.

It is in meeting this challenge that the prior art has often been wanting. Prior art techniques have generally involved interposing adhesive in the form of liquid or paste epoxy between the mating surfaces, having the adhesive flow when the surfaces are brought together, and allowing the adhesive to cure to form the required bond. This technique has several drawbacks and disadvantages. The mating surfaces are generally "roughened" to promote a strong bond. Thus, if too little adhesive is used, there will be insufficient adhesive flow over the "roughened" surfaces, resulting in a poor bond. In turn, a poor bond may compromise the structural integrity of the resulting laminate substrate.

Furthermore, because wire bonds are attached at or near the inner edge of the aperture in the laminate layer, it is usually important to have this inner edge area well adhered to the underlying copper stiffener. Too little adhesive in this area, or too little flow to the area, will often cause the inner edge of the aperture to be separated from the underlying copper stiffener. Such separation creates catch points in which contaminants may collect. Because the wire bonds attach to the substrate near these catch points, the presence of contaminant in close proximity to the wire bonds risks compromising the performance of the chip mounted to the substrate.

Any gaps between the inner edge of the aperture and the copper stiffener may also entrap air bubbles during or after the chip and substrate are covered with dielectric encapsulant. The presence of air bubbles during or after encapsulation may interfere with the ability of the encapsulant to remain bonded to the substrate or otherwise inhibit its proper functioning.

In addition, when separated from the copper stiffener, the inner edge of the laminate layer forms an undesirable, cantilevered structure. Because the laminate layer is somewhat flexible, its cantilevered edge acts like a diving board when orthogonal forces are applied to it. Wire bonding operations at the edge of the aperture often involve orthogonal forces; therefore, this "diving board" effect may interfere with successful wire-bonding at the inner edge of the aperture.

Although too little adhesive is undesirable, as explained in the above discussion, simply supplying an abundance of adhesive generates its own problems. Too much adhesive, and correspondingly too much adhesive flow, generally causes adhesive to be deposited or "squeezed out" from between the mating surfaces of the stiffener and the laminate layer and into the cavity of the substrate. The presence of such adhesive in the cavity prevents the chip from lying flat and in substantial contact with the underlying stiffener. As discussed above, not only does such non-flush mounting of the chip reduce thermal conductivity to the stiffener, but it also may interfere with optimal wire bond connections to the chip. This problem is compounded by the fact that, for optimal chip performance, the inner edge of the aperture is located as close as possible to the opposing outer edge of the chip placed in the aperture. Thus, even relatively slight amounts of "bleeding" into the cavity from the mating surfaces are likely to interfere with flush mounting and centering of the chip.

One attempted solution of the prior art is to simply avoid placing adhesive at locations on either the stiffener or the laminate layer which are near the inner edge of the aperture. As discussed above, however, the need to wire bond at the inner edge, and the need to avoid undesirable catch points and cantilevering, require adhesion at these locations.

Another general solution is to apply adhesive in quantities and at locations which compensate for the anticipated distance through which the adhesive will flow. In practice, however, it is difficult to predict and model the distances through which adhesive will flow. It is correspondingly difficult to control the flow process to avoid having adhesive deposited on the surface destined to receive the chip.

A related approach to controlling adhesive flow is to screen the epoxy paste onto the surface of the TLC (thin-light card) and laminate it to the copper stiffener. The screening technique allows for uniform coverage of the TLC, but the epoxy must still be in a state to flow on the "roughened" surfaces and form a good bond. The variability of such flow still risks the screened adhesive bleeding into the aperture or cavity area.

Other prior art attempts to deposit just the right amount of adhesive in just the right locations between the substrate and the stiffener have had similarly mixed results. For example, in one approach, the substrate in the form of a card is formed by adhering a glass cloth impregnated with epoxy between the laminate layer and the stiffener in a single lamination process. The impregnated glass cloth has been suitably "b-staged" (defined below) before the lamination.

In one such pre-impregnated application, the laminate substrates are two inch by two inch squares, approximately, with approximately a one inch by one inch cavity centered in the square. Frequently, such smaller products are formed from larger, laminate sheets and correspondingly sized sheets of copper stiffener. The adhesive in the pre-impregnated glass cloth must not be deposited on the portion of the copper stiffener framed by the aperture and destined to receive the chip.

Accordingly, one or more windows are cut out of the glass cloth at locations and with dimensions corresponding to those of the cavity on the laminate sheet. In the case of a square cavity of one inch by one inch, corresponding squares are cut out from the glass cloth. This procedure has its own drawbacks and disadvantages. First, the windowed sheet of glass cloth, the laminate layer, and the copper stiffener must be kept in alignment or in registration with each other. Such registration is necessary to avoid having the adhesive on the cloth located within the apertures or located too close to the apertures so that it bleeds into them when the layers are laminated to each other. The need to maintain strict registration is compounded when there are multiple cut-outs in the glass cloth which need to remain aligned with corresponding apertures in the laminate card. Maintaining such registration complicates the manufacturing process, and misregistration results in rejected product.

As a further drawback, the coefficients of thermal expansion (CTEs) of the glass cloth, copper, and laminate layer are not usually identical, causing each to shrink or expand by different amounts during heated processing steps. This dimensional instability can potentially prevent the glass cloth windows from aligning with the apertures, again resulting in either the presence of adhesive in the cavity or the bleeding of adhesive from the inner edges into the cavity. Again, such dimensional instability, as with misregistration in general, may result in rejected product.

Another prior art approach has been to apply a uniform adhesive coating to substantially all of the surface of the stiffener to be mated to the laminate layer. The theory is that, if the adhesive on the stiffener which spans the aperture is in the form of a uniform layer, the chip will be mounted evenly, and its performance and ability to dissipate heat will not be adversely effected. This approach may avoid any drawbacks of misregistration or mismatched CTE. Because the stiffener and laminate layer are still being pressed together, however, there is still a tendency for the adhesive at and near the inner edge of the aperture to be squeezed out so that it bleeds onto the mounting area of the stiffener spanning the aperture. This bleeding of adhesive is likely to make the mounting area destined for the chip uneven, despite the fact that the mounting area was initially covered with a uniform adhesive layer.

Yet another conventional approach is to apply adhesive to either the laminate layer or the copper stiffener and partially cure it to reduce its flow characteristics. This approach is known to those skilled in the art as a "b-staging" process. The b-staged adhesive is then interposed between the layers to be mated and subjected to still higher temperatures and pressures to induce further, albeit reduced, flow to form the requisite bonds. The theory is that the reduced flow will be more predictable. In practice, however, even after such partial curing, the further flow characteristics of the adhesive are variable and difficult to predict. Furthermore, overcuring of the adhesive during the b-staging risks having insufficient flow to form the desired bond. Such insufficient flow may create catch points and air pockets in the adhesive layer, along with their attendant disadvantages discussed previously. On the other hand, undercuring of the adhesive risks bleeding of the adhesive into the cavity, with its attendant disadvantages discussed above. Accordingly, it is difficult to achieve the proper balance between under- and over-curing in order to impart the desired flow characteristics to the adhesive.

There is thus a need to adhere the metal stiffener and the laminate layer to each other without having the adhesive bleed into the aperture or cavity of the resulting substrate. There is a countervailing need for sufficient adhesive and sufficient adhesive flow to form a good bond, and one which is free of air pockets or separation of the layers from each other. There is a further need for a process for adhering the stiffener to the laminate layer which is predictable and hence easy to implement consistently, and with concomitantly higher yields.

SUMMARY OF THE INVENTION

To meet these and other needs, and in consideration of its purposes, the present invention in one aspect is a cavity-type module. The module is formed with a circuitized laminate layer and an aperture defined through the planar surfaces of the laminate layer. A planar metal stiffener is disposed against one of the planar surfaces of the laminate layer. The stiffener has a mounting portion of its surface which spans the aperture. The mounting portion and the aperture together define the cavity of the module. The boundary of the mounting portion is thus defined by the inner edge of the aperture.

A joining layer is interposed between the stiffener and the laminate layer to adhere the mating surfaces to each other. The joining layer is formed from a film of photoimageable material which has been selectively exposed to actinic radiation and developed to form a window. The window in the joining layer has dimensions which are substantially similar to the dimensions of the aperture. The window and the aperture are aligned with each other, and a semiconductor is secured to the mounting area which is accessible through the window and the aperture.

A method in accordance with the present invention is used to form a chip carrier with a laminate layer with an aperture defined in the laminate layer and a corresponding stiffener joined to the laminate layer. The improved method involves applying a joining layer of photoimageable material to either the laminate layer or the stiffener. The photoimageable material is then exposed or irradiated, except for a window of material having a size substantially similar to the aperture defined in the laminate layer. The laminate layer and the stiffener are then adhered to each other with the joining layer interposed between them, and with the window aligned with the aperture. The unexposed photoimageable material is washed away during a subsequent development step.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE PREFERRED EMBODIMENT

Figure 1:
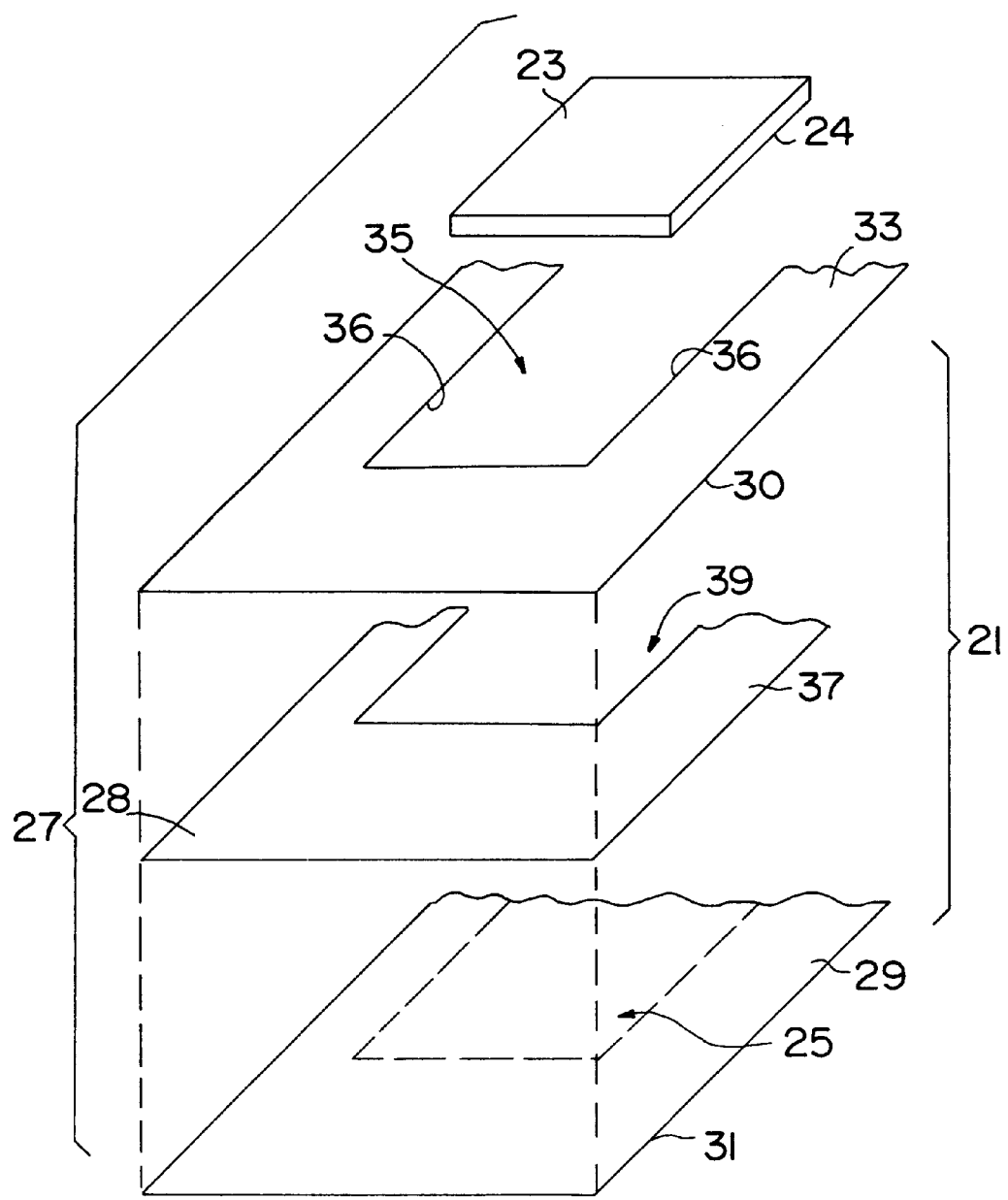
FIG. 1 is an exploded, partly schematic, perspective view of a portion of a cavity-type chip module in accordance with the present invention.
Figure 3:
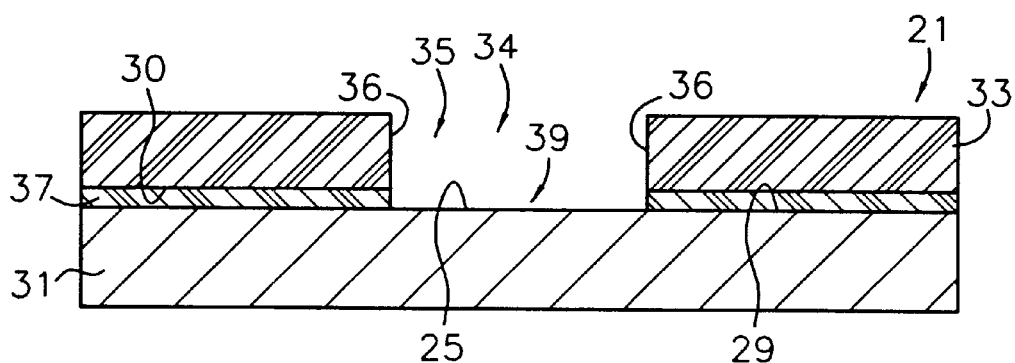
FIG. 3 is a side elevational view of the substrate of FIG. 2 after further processing.

Referring now to the drawing, and in particular to FIGS. 1 and 3, a printed circuit board according to the present invention is shown as a cavity-type chip module 27. The module 27 includes a semiconductor 23 secured to a laminate substrate 21. Specifically, semiconductor 23 is secured to a mounting area 25 defined on a first or bottom layer 31, which, in this embodiment, is in the form of a metal stiffener 31, preferably made of copper. It is understood that the use of the term "stiffener" in this document and in the art is not intended to restrict the role of stiffener 31 of substrate 21 to that of structural stiffening. It will be appreciated that stiffener 31 also serves as a mounting surface and, when made of metal, as a ground plane or heat dissipation layer.

As detailed below, the substrate 21 is structured to avoid bleeding of adhesive into the mounting area 25 so that semiconductor 23 can seat flush on planar surface 29 of copper stiffener 31. In this way, stiffener 31 functions optimally as a heat sink, and electrical connections (not shown) to the semiconductor 23 are uniform.

Substrate 21 is formed from at least three layers laminated in substantial registration with each other. Substrate 21 generally includes one or more layers formed from an epoxy resin. Substrate 21 may likewise be formed from epoxy-aramid compositions, or from non-epoxy-based materials, such as PTFE and silica composites, and BT resins known in the art.

The bottom layer of substrate 21 comprises the metal stiffener 31 discussed above. The top layer 33 is a laminate layer, typically formed from one of the epoxy or non-epoxy resins discussed immediately above. Top layer 33 has an aperture 35 defined in and extending between opposite planar surfaces of top layer 33. Aperture 35 is typically square or rectangular and sized to be slightly larger than the outer dimension of semiconductor 23.

Importantly, the third layer of substrate 21 is a joining layer 37 interposed between planar surface 29 of stiffener 31 and opposing mating surface 30 of top layer 33. Joining layer 37 is made of any of a variety of permanent photoresists, photoimageable dielectrics, or other photoimageable materials, collectively referred to in this document as "photoimageable material." When suitably exposed to radiation, heat, and pressure, joining layer 37 bonds the top layer 33 to the stiffener 31 substantially without adhesive bleeding into mounting area 25.

In particular, a window 39 is defined in joining layer 37 by processes described below. Window 39 has substantially the same dimensions as aperture 35 in top layer 33. When the layers 31, 33, and 37 are laminated to each other, a cavity 34 (see FIGS. 2 and 3) is defined by aperture 35, window 39, and mounting area 25 spanning the aperture 35 and window 39. Otherwise stated, the photoimageable material is substantially absent from mounting area 25 when substrate 21 is fully processed.

Accordingly, semiconductor 23 can be secured to mounting area 25 and electrically coupled to the circuits (not shown) of top layer 33, such as by wire bonding, without encountering any of the photoimageable material. The substantial absence of photoimageable material and other topography from mounting area 25 allows planar chip surface 24 to be substantially flush against mounting area 25 so that heat is optimally dissipated from semiconductor 23.

Preferably, joining layer 37 is an epoxy-based, photoimageable, dry film dielectric material. The film is laminated to the stiffener 31 using vacuum lamination, hot roll lamination, or other suitable lamination techniques. The film is then baked to remove any residual solvents. One suitable dry film has been found to be of the type designated "ASMDF," the characteristics, composition, and application of which are now described. Preferably, the dielectric constant of the ASMDF dielectric film is less than about 5, more preferably less than about 4.

The dielectric film of the preferred embodiment is comprised of solids and solvent. The solids are preferably comprised of the following: from about 10% to about 80%, preferably from 20% to 40%, more preferably about 30%, of phenoxy polyol resin which is the condensation product of epichlorohydrin and bisphenol A, having a molecular weight of from about 40,000 to 130,000, preferably about 60,000 to 90,000, more preferably greater than 60,000; from about 20% to about 90%, preferably about 25% to 30%, most preferably about 25%, of an epoxidized multifunctional bisphenol A formaldehyde novolac resin having a molecular weight of from about 4,000 to 10,000, preferably about 5,000 to 7,000; from 0% to about 50%, preferably from about 35% to 50%, more preferably about 40% to about 45%, most preferably about 45%, of a halogenated, preferably brominated, diglycidyl ether of bisphenol A having a molecular weight of from about 600 to about 2,500, preferably about 1,000 to 1,700; and from about 0.1 to about 15 parts, preferably about 5 parts, by weight of the total resin weight, a cationic photoinitiator. The solvent component of the dielectric film preferably is comprised of propyleneglycol monomethyl ether acetate and 0 to less than about 10% propylene carbonate. The propylene carbonate is preferably the carrier for the preferred photoinitiator.

Preferably the phenoxy polyol resin has an epoxide value of from about 0.001 to about 3, more preferably from about 0.01 to about 0.3, most preferably about 0.03 equivalents per kilogram, a weight per epoxide of from about 10,000 to about 60,000, more preferably from about 20,000 to about 50,000, most preferably about 37,000 and a glass transition temperature of from about 80 to about 150° C., more preferably from about 90 to about 110° C., most preferably about 98° C.

Preferably, the multifunctional epoxy bisphenol A formaldehyde novolac resin has an epoxide value of from about 1 to about 10, more preferably from about 3 to about 6, most preferably about 4.7 equivalents per kilogram, a weight per epoxide of from about 180 to about 300, more preferably from about 190 to about 230, most preferably about 215 and a melting point of from about 60° C. to about 150° C., more preferably from about 70° C. to about 90° C., most preferably about 82° C.

Preferably, the diglycidyl ether of the halogenated bisphenol A has an epoxide value of from about 0.1 to about 5, more preferably from about 1 to about 3, most preferably about 1.5 equivalents per kilogram, a weight per epoxide of from about 200 to about 1000, more preferably from about 500 to about 750, most preferably about 675 and a melting point of from about 70° C. to about 150° C., more preferably from about 80° C. to about 110° C., most preferably about 97° C.

A suitable phenoxy polyol resin is available under the trade name "PKHC," formerly available from Union Carbide Corp., now available from Phenoxy Resin Associates. A suitable octafunctional bisphenol A, formerly available under the trade name Epirez SU-8 from High Tek Polymers, is now available as "Epon SU8" from Shell Chemical Company. A suitable tetrabromobisphenol A, formerly available under the trade name "Epirez 5183" from High Tek Polymers, is now available as "Epon 1183" from Shell Chemical Company. A suitable complex triarylsulfonium hexafluoroantimonate salt photoinitiator, formerly available under the trade name UVE 1014 from General Electric Company, is now available as UVI 6974 from Union Carbide Company.

The dielectric film is thermally stable particularly at lamination temperatures preferably up to at least 125° C. for 1 hour. One suitable formulation of the ASMDF dielectric film is as follows: the photoimageable dielectric composition was prepared having a solids content of from about 86.5% to about 89%, such solids comprising about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; and 3.84% AEROSIL 380, an amorphous silicon dioxide from Degussa. The solvent was a mixture of methyl ethyl ketone and propylene glycol monomethyl ether acetate.

The film comprising joining layer 37 is exposed to radiation through a photo-tool. Specifically, a mask or other photo-tool expedient is used to expose a first area 28 of joining layer 37, thus partially curing it and preparing it for subsequent adhesion and lamination to mating surfaces on layers 31, 33. The photo-tool expedient is further used to prevent exposure of a second area 38 (see FIG. 2) of joining layer 37 corresponding ultimately to the window 39. The unexposed photoimageable material of second area 38 is susceptible to removal from the joining layer 37 by appropriate development processing steps discussed below.

The top layer 33 is preferably in the form of a TLC. Preferred TLCs range in size from about 5 mils to about 30 mils in thickness, are circuitized, and are built from multiple layers using conventional techniques. The TLC is laminated to stiffener 31 with joining layer 37 interposed between them, preferably by heating to a temperature of about 125° C. at suitable pressure. Second area 38 of joining layer 37 is aligned with aperture 35 of top layer 33. At this stage, as shown in FIG. 2, planar surface 29 of stiffener 31 has its mounting area 25 aligned with aperture 35 to define the cavity 34, but mounting area 25 is still covered by the unexposed, photoimageable material of second area 38.

Cavity 34 is developed or washed using a horizontal, conveyorized spray tool and a suitable solvent, such as gamma-butyralactone or propylene carbonate. As a result, the photoimageable material is removed from second area 38 to define window 39 in joining layer 37.

Figure 2:
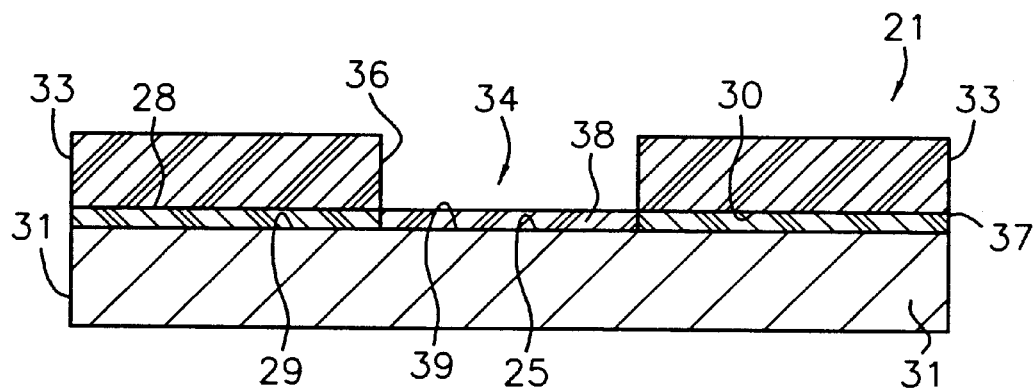
FIG. 2 is side elevational view of the substrate of the module of FIG. 1 in the process of being built.

Referring to FIG. 2, unexposed second area 38 is located on joining layer 37 to facilitate alignment with aperture 35. In addition, unexposed second area 38 has dimensions which substantially correspond to those of aperture 35 (FIG. 3). Preferably, such corresponding dimensions of second area 38 are slightly larger than those of aperture 35, where "slightly larger" means an appropriate size indicated after suitable tolerance analysis has been performed.

The slightly larger dimensions of second area 38 thus afford greater tolerance in aligning aperture 35 within the boundary defined by second area 38. In this way, even if laminate top layer 33 is laminated in slight misalignment relative to joining layer 37, the resulting cavity 34 is still spanned by unexposed photoimageable material susceptible to being developed away, leaving the mounting area 25 substantially free of photoimageable material. The increased tolerances afforded by the above expedient are all the more important when multiple apertures 35 and second areas 38 are formed in a matrix from larger, "panel"-type sheets, and the multiple apertures and areas need to be aligned with each other across the full dimensions of such larger sheets.

An alternative method of rendering mounting area 25 free of photoimageable material is to leave the photoimageable material of joining layer 37 unexposed; laminate the layers 31, 33, and 37 to each other; and then develop away the unexposed photoimageable material in cavity 34 which spans mounting area 25. As such, aperture 35 (which defines the edge of cavity 34) is used as an "etch mask" to determine the size of second area 38 from which the photoimageable material is to be removed by developer solvent. The unexposed photoimageable material outside the cavity 34 is not washed away by such development by virtue of the lamination and adhesion of the adjacent laminate and stiffener layers 33, 31 on either side of joining layer 37.

The resulting cavity-type substrate 21 is then fully cured by baking at a suitably high temperature. Cavity 34 is preferably slightly larger than the chip to be mounted in cavity 34. In one suitable application, cavity 34 is a square with sides ranging between about 8 mm and 44 mm. Other sizes are also possible, of course, depending on the size of the chip to be mounted in cavity 34.

The exposure to heat, pressure, and radiation bonds the three layers 33, 37, and 31 to each other. Furthermore, the degree of flow of the photoimageable material in joining layer 37 is controlled by selecting or modifying the amount of radiation exposure. On the one hand, the radiation, heat, and pressure are selected to give joining layer 37 sufficient flow characteristics to negotiate topographies on roughened planar surface 29 and mating surface 30 and form a good bond without air gaps or voids. On the other hand, the risk of excess flow or bleeding into mounting area 25 from inner edges 36 of aperture 35 is reduced by not exposing the photoimageable material of second area 38, and then subsequently washing the photoimageable material away in the development process described above.

Mounting area 25 and corresponding cavity 34 thus remain substantially free of adhesive or other non-uniform topography which would otherwise prevent semiconductor 23 from seating flush in mounting area 25. Optionally, the risk of bleeding into mounting area 25 can be further reduced by oversizing window 39 relative to aperture 35. Of course, other photoimageable materials and dry films may also be suitable for forming joining layer 37. Furthermore, depending on the particular application, radiation exposure doses, heating temperatures, pressures, bake and lamination times, and developing solvents may be suitably varied. For example, liquid photoimageable material may be used in place of dry film and applied by curtain coating, roller coating, screen coating, slot coating, or by other techniques suitable for application to stiffener 31 or even top layer 33.

In still other variations, additional materials are interposed between stiffener 31 and top layer 33, including adhesives containing thermally conductive materials such as boron nitride, electrically conductive materials, and CTE-controlling materials such as silica-based materials. As still a further alternative, non-photoimageable material may be used to form joining layer 37, and the step of washing the mounting area 25 with developer solvent may be used to remove such non-photoimageable material from aperture 35.

Although the present invention has been illustrated in the form of a chip module, the invention encompasses any variety of substrates for carrying electronic components, including printed circuit boards, whether a chip is mounted thereto or not. The substrate encompassed by the present invention may comprise printed circuit boards generally or, more specifically, a thin-light card, a laminate chip carrier, or a cavity-type chip carrier.

In addition to the advantages apparent from the foregoing description, chip module 27 and its substrate 21 according to the present invention are structured so that the heat of semiconductor 23 can be optimally dissipated by virtue of its flush contact with stiffener 31. As a further advantage, even when semiconductor 23 is closely fit into aperture 35, the mounting of semiconductor 23 is not impeded by the presence of adhesive or other non-uniform material because any bleeding from inner edges 36 of aperture 35 is substantially prevented by the inventive processing steps and resulting structures of the present invention. A still further advantage of being able to mount semiconductor 23 evenly is that wire bond connections to semiconductor 23 are optimized.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. In a method of forming a chip carrier in which a substantially planar, circuitized laminate layer and a corresponding stiffener are joined to each other, and in which the laminate layer has an aperture defined therein which exposes a corresponding mounting area on the stiffener, the aperture and the mounting area defining a cavity in the chip carrier, the improvement comprising the steps of:

applying a joining layer of adhesive material to at least one of the laminate layer and the stiffener;

exposing the adhesive material to radiation, excluding an area of the material having a size substantially similar to that of said aperture, the unexposed adhesive material being susceptible to removal from the joining layer;

laminating the laminate layer to the stiffener with the joining layer interposed therebetween; and developing the cavity to remove the adhesive material therefrom to reveal the surface of the mounting area and render the mounting area substantially free of the adhesive material.

2. The method of claim 1, further comprising the steps of:

forming the joining layer from a film of photoimageable material; and removing the unexposed photoimageable material when the cavity is developed.

3. The method of claim 2, further comprising the step of selectively exposing the photoimageable material surrounding the window to sufficient radiation to control the flow characteristics of the photoimageable material when subsequently laminated under heat and pressure.

4. The method of claim 2 in which the aperture has an inner edge defining the boundary of the mounting area, and further comprising the step of inhibiting bleeding of the photoimageable material from the inner edge of the aperture into the mounting area by selective application of radiation, heat, and pressure to the photoimageable material to vary the flow characteristics of the photoimageable material.

5. The method of claim 1, further comprising the step of mounting an electronic component to the mounting area.

6. The method of claim 5, further comprising the step of forming the stiffener from copper, and wherein the mounting step comprises disposing a planar surface of the electronic component substantially flush against the mounting area to optimize thermal conductivity between the electronic component and the stiffener.

7. In a method of forming a chip carrier in which a substantially planar, circuitized laminate layer and a corresponding stiffener are joined to each other, and in which the laminate layer has an aperture defined therein which exposes a corresponding mounting area on the stiffener, the aperture and the mounting area defining a cavity in the chip carrier, the improvement comprising:

applying a joining layer of adhesive material to at least one of the laminate layer and the stiffener;

laminating the laminate layer to the stiffener with the joining layer interposed therebetween; and developing the cavity to remove the adhesive material therefrom to reveal the surface of the mounting area and render the mounting area substantially free of the adhesive material; and retaining in the chip carrier the adhesive material outside the cavity by means of contact by the laminate layer and the stiffener with the adhesive material.

* * * * *